United States Patent
Nakamura

(10) Patent No.: US 6,703,665 B1
(45) Date of Patent: Mar. 9, 2004

(54) TRANSISTOR

(75) Inventor: Hideyuki Nakamura, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/639,811

(22) Filed: Aug. 17, 2000

(30) Foreign Application Priority Data

Aug. 20, 1999 (JP) ............................................ 11-233405

(51) Int. Cl.[7] .......................... H01L 29/74; H01L 29/80; H01L 29/76
(52) U.S. Cl. ................. 257/341; 257/342; 257/339; 257/328; 257/262; 257/263; 257/139; 257/302; 257/333
(58) Field of Search ................................ 257/342, 341, 257/339, 328, 262, 263, 139, 302, 333

(56) References Cited

U.S. PATENT DOCUMENTS

| | | | |
|---|---|---|---|
| 4,754,310 A | | 6/1988 | Coe .............................. 357/13 |
| 4,972,239 A | * | 11/1990 | Mihara ........................ 357/23.4 |
| 5,016,066 A | | 5/1991 | Takahashi ................... 357/23.4 |
| 5,661,314 A | | 8/1997 | Merrill et al. ................ 257/144 |
| 5,893,736 A | * | 4/1999 | Lee et al. ..................... 438/271 |
| 5,897,355 A | * | 4/1999 | Bulucea et al. .............. 438/273 |
| 5,929,481 A | * | 7/1999 | Hshieh et al. ................ 257/328 |
| 5,939,752 A | * | 8/1999 | Williams ..................... 257/339 |
| 6,117,738 A | * | 9/2000 | Tung ........................... 438/286 |
| 6,165,822 A | * | 12/2000 | Okuno et al. ................ 438/142 |
| 6,246,092 B1 | * | 6/2001 | Fujihira et al. .............. 257/341 |

FOREIGN PATENT DOCUMENTS

| | | | |
|---|---|---|---|
| DE | 0118921 | * | 9/1984 |
| DE | 3519389 A1 | | 12/1985 |
| EP | 0-255-970 | | 2/1988 |
| JP | 57042164 A | * | 3/1982 |
| JP | 2-37777 | | 2/1990 |
| JP | 5-283432 | | 10/1993 |
| WO | WO 99/04437 | | 1/1999 |

OTHER PUBLICATIONS

Deboy et al., "New Generation of High Voltage MOSFETS Breaks the Limit Line of Silicon"; International Electron Devices Meeting Technical Digest, San Francisco, CA, USA, Dec. 6–9, 1998, pp. 683–685.

* cited by examiner

Primary Examiner—George Eckert
Assistant Examiner—Joseph Nguyen
(74) Attorney, Agent, or Firm—Armstrong, Kratz, Quintos, Hanson & Brooks, LLP.

(57) ABSTRACT

A withstand voltage region of a second conductivity type is formed in a drain layer of a first conductivity type in a semiconductor substrate, and a conductive region of the first conductivity type is partly formed in the withstand voltage region by being diffused from the surface of the withstand voltage region. The conductive region has a bottom held in contact with the drain layer. A base region and a source region are formed in the surface of semiconductor substrate, with a region between the source region and the conductive region serving as a channel region, thus producing a transistor. When a voltage is applied to a gate electrode film on the channel region to form an inverted layer, the source region and the drain layer are connected to each other by the inverted layer and the conductive region.

9 Claims, 15 Drawing Sheets

TRANSISTOR

FIELD OF THE INVENTION

The present invention relates to the art of a field-effect transistor such as a MOSFET, an IGBT, or the like.

DESCRIPTION OF THE RELATED ART

One conventional MOSFET will be described below with reference to FIGS. 39 and 40 of the accompanying drawings.

As shown in FIG. 39, a conventional MOSFET 101 disclosed in literature comprises a drain layer 105 of single crystal of silicon and doped with a high concentration of an $N^+$-type impurity, and an $N^-$-type conductive layer 106 deposited on the drain layer 105 by epitaxial growth. The conductive layer 106 includes base regions 112 formed by diffusing a P-type impurity from the surface thereof.

Each of the base legions 112 includes a ring-shaped source region 114 formed by diffusing an N-type impurity from the surface thereof. A channel region 115 lies between the outer end of the base region 112 and the outer peripheral edge of the source region 114.

The base region 112, the source region 114, and the channel region 115 make up one rectangular cell 117. The MOSFET 101 has a number of cells 117 that are arranged regularly in a grid-like pattern.

FIG. 40 shows the layout of the cells 117 of the MOSFET 101.

A gate insulating film 121 in the form of a silicon oxide film is disposed on the channel regions 115 of adjacent two of the cells 117 and the surface of the conductive layer 106 between those two cells 117. A gate electrode film 131 is disposed on the gate insulating film 121.

The base region 112 has a surface exposed inside of the ring shaped source region 114. An inter layer insulation film 122 is disposed on the gate electrode film 131.

Reference numeral 132 represents a part of the source electrode film deposited on the surface of the source region 114 and the base region 112 and a part deposited on the interlayer insulation film 122. Those two parts are connected each other.

The source electrode film also has a part deposited on the surface of gate electrode film 131 and is insulated from the part of the source electrode film deposited on the surface of the source region 114 and base region 112 and the part deposited on the interlayer insulation film 122.

The MOSFET 101 also has a protective film 135 disposed on the source electrode films 132. The protective film 135 and the interlayer insulation films 122 are patterned to expose portions of the source electrode films 132 and also portions of the thin metal film connected to the gate electrode films 131.

A drain electrode 133 is disposed on the surface of the drain layer 105 remotely from the conductive layer 106. The drain electrode 133, the exposed portions of the source electrode films 132, and the exposed portions of the thin metal film connected to the gate electrode films 131 are connected to respective external terminals which are connected to an electric circuit for operating the MOSFET 101.

To operate the MOSFET 101, the source electrode films 132 are placed on a ground potential, and a positive voltage is applied to the drain electrode 133. When a gate voltage (positive voltage) equal to or higher than a threshold voltage is then applied to the gate electrode films 131, an N-type inverted layer is formed on the surface of the P-type channel region 115 of each cell 117, and the source region 114 and the conductive layer 106 are connected to each other by the inverted layer, so that a current flows from the drain electrode 133 to the source electrode films 132.

When a voltage, e.g., a ground potential, lower than the threshold voltage is thereafter applied to the gate electrode films 131, the inverted layer is eliminated, and the base regions 112 and the conductive layer 106 are reverse-biased, so that no current flows between the drain electrode 133 and the source electrode films 132.

Therefore, the drain electrode 133 and the source electrode films 132 can be connected to each other or disconnected from each other by controlling the voltage applied to the gate electrode films 131. The MOSFET 101 is widely used as a high-speed switch in power electric circuits such as power supply circuits, motor control circuits, etc.

While the drain electrode 133 and the source electrode films 132 are being disconnected from each other, a large voltage may be applied between the drain electrode 133 and the source electrode films 132.

Since the base regions 112 including the channel regions 115 and the conductive layer 106 are reverse-biased while the drain electrode 133 and the source electrode films 132 are being disconnected from each other, the withstand voltage, i.e. the avalanche breakdown voltage, of the MOSFET 101 is determined by the withstand voltage of the PN junction between the base regions 112 and the conductive layer 106.

PN junctions are classified into a planar junction, a cylindrical junction, and a spherical junction according to the shape of a diffusion layer of higher concentration. It is known that the planar junction has a highest withstand voltage and the spherical junction has a lowest withstand voltage.

In the MOSFET 101 composed of the many cells 117, the planar junction is formed at the bottom of each of the cells 117. However, since the cells 117 are polygonal, e.g., rectangular, in shape, the cylindrical junction is necessarily formed at the sides of each of the cells 117 and the spherical junction is necessarily formed at the top of each of the cells 117. The overall withstand voltage is determined by the withstand voltage at the top of each of the cells 117.

SUMMARY OF THE INVENTION

It is therefore an object of the present invention to provide a transistor having a high withstand voltage.

Another object of the present invention is to provide a transistor having a low conduction resistance.

To achieve the above objects, there is provided in accordance with the present invention a transistor comprising a semiconductor substrate having a drain layer of a first conductivity type and a withstand voltage region of a second conductivity type disposed on the drain layer, a conductive region of the first conductivity type formed by an impurity partly diffused into the semiconductor substrate from the side of the withstand voltage region side, the conductive region layer of the first conductivity type having a bottom connected to the drain, a base region of the second conductivity type formed by an impurity partly diffused into the semiconductor substrate from the side of the withstand voltage region side, a source region of the first conductivity type formed in the base region, a gate insulating film having a central region positioned on the base region, an end positioned on the conductive region, and an opposite end positioned on the source region, a gate electrode film disposed on the gate insulating film, a channel region positioned between the source region and the conductive region and including a surface of the base region below the gate insulating film, a source electrode electrically connected to the source region and the base region, and a drain electrode electrically connected to the drain layer.

The base region has a surface concentration higher than the surface concentration of the withstand voltage region.

The conductive region has a surface concentration higher than the surface concentration of the withstand voltage region.

The base region has a surface concentration higher than the surface concentration of the conductive region.

The conductive region has a surface surrounded by a region having a conductivity type opposite to the conductivity type of the conductive region.

The base region is diffused from a surface of the withstand voltage region and a surface of the conductive region, and the bottom of the base region has a part in contact with the withstand voltage region and a part in contact with the conductive region.

The base region has a portion positioned within the conductive region and serving as the channel region.

The source region extends between the base region formed in the conductive region and the base region formed in the withstand voltage region.

The base region is diffused from a surface of the withstand voltage region and spaced from the conductive region, the gate insulating film and the gate electrode film being disposed on the surface of the withstand voltage region which is sandwiched between the base region and the conductive region, the channel region includes the surface of the withstand voltage region below the gate insulating film.

The transistor further comprises a low-resistance layer of the first conductivity type disposed on a side of the semiconductor substrate remotely from the withstand voltage region, the low-resistance layer having a concentration higher than the concentration of the drain layer.

The transistor further comprises a collector layer of the second conductivity type disposed on a side of the semiconductor substrate remotely from the withstand voltage region.

With the above arrangement of the present invention, the impurity of the first conductivity type is partly diffused into the withstand voltage region of the second conductivity type through a window defined in a silicon oxide film or the like for thereby forming the conductive region of the first conductivity type in a desired position in the withstand voltage region of the second conductivity type.

The base region of the second conductivity type is partly formed on the withstand voltage region of the second conductivity type by introducing and diffusing the impurity using an oxide film or the like with a window as a mask. When the source region is formed around the base region, the channel region is formed between an outer circumferential end of the base region and the source region. The outer circumferential portion of the base region may be extended into the conductive region or may be spaced from the conductive region.

The bottom of the base region is connected to the withstand voltage region, which includes a projecting portion that projects into a region formed by the drain layer and the conductive region that are of the first conductivity type which is opposite to the conductivity type of the withstand voltage region. Therefore, a depletion layer tends to be spread in the low-concentration withstand voltage region, resulting in a high withstand voltage.

The base region extends into the conductive region. However, since the concentration of the base region is higher than the concentration of the conductive region, if a projecting portion is not disposed as a vertex on the planar shape of the base region in the conductive region, then no spherical junction is formed, resulting in a high withstand voltage.

The conductive region is formed by diffusion. If no spherical junction is present, then the withstand voltage is not relatively lowered even with an increased concentration of the conductive region. Therefore, a low-resistance transistor can be provided.

FIG. 34 of the accompanying drawings is a graph showing the drain-to-source withstand voltage plotted as the surface concentration of the conductive region is varied without changing the diffused structure, and FIG. 35 of the accompanying drawings is a graph showing the conduction resistance per unit area as the withstand voltage is varied.

It can be seen from FIGS. 34 and 35 that while the conduction resistance of the conventional transistor is highly increased when the withstand voltage is increased, the conduction resistance according to the present invention can be reduced even when the withstand voltage is increased.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 32(*b*) is a cross-sectional view showing the manner in which a depletion layer spreads in the transistor according to the present invention;

DESCRIPTION OF THE PREFERRED EMBODIMENTS

Figure 1:
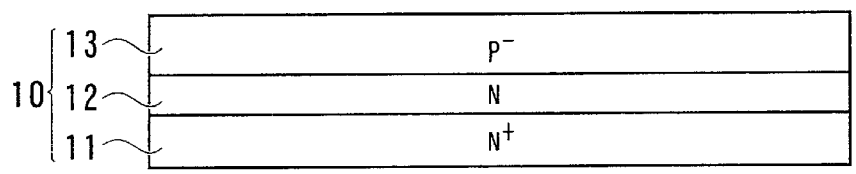
FIGS. 1 through 20 are cross-sectional views illustrative of a process of manufacturing a transistor according to the present invention.

As shown in FIG. 1, a semiconductor substrate 10 has an $N^+$-type substrate 11, a drain layer 12 disposed on the $N^+$-type substrate 11, and a withstand voltage region 13 disposed on the drain layer 12.

The $N^+$-type substrate 11, the drain layer 12, the withstand voltage region 13 are made of a single crystal of silicon. An N-type impurity is added to the $N^+$-type substrate 11, so that the $N^+$-type substrate 11 is of the N conductivity type. The drain layer 12 and the withstand voltage region 13 are formed on the $N^+$-type substrate 11 in the order named by an epitaxial process. During the epitaxial growth, an N-type impurity is added to the drain layer 12, so that the drain layer 12 is of the N conductivity type. During the epitaxial growth, a P-type impurity is added to the withstand voltage region 13, so that the withstand voltage region 13 is of the P conductivity type.

The $N^+$-type substrate 11 is of a concentration ranging from $1 \times 10^{18}$ to $1 \times 10^{19}$ atoms/cm$^3$, and the drain layer 12 has a concentration ranging from $4 \times 10^{13}$ to $4 \times 10^{15}$ atoms/cm$^3$ and a thickness ranging from 5 μm to 200 μm. The withstand voltage region 13 has a concentration ranging from $3 \times 10^{13}$ to $3 \times 10^{15}$ atoms/cm$^3$ and a thickness ranging from 3 μm to 15 μm. Thus, the concentration of the withstand voltage region 13 is lower than the concentration of the drain layer 12.

Figure 2:
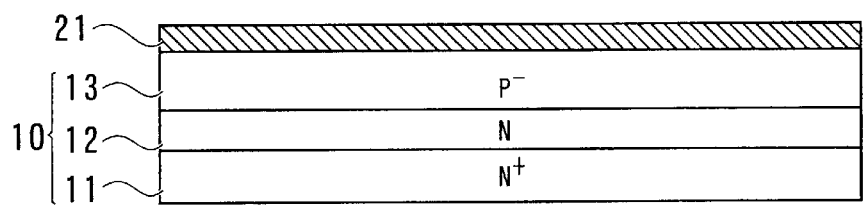

The semiconductor substrate 10 is thermally oxidized to form a primary oxide film 21 in the form of a silicon oxide film having a thickness of about 1.0 μm, on the surface of the withstand voltage region 13, as shown in FIG. 2. In FIG. 2 and other figures described later on, an oxide film on the reverse side of the assembly is omitted from illustration.

The primary oxide film 21 is patterned according to a photolithographic process and an etching process.

Figure 3:
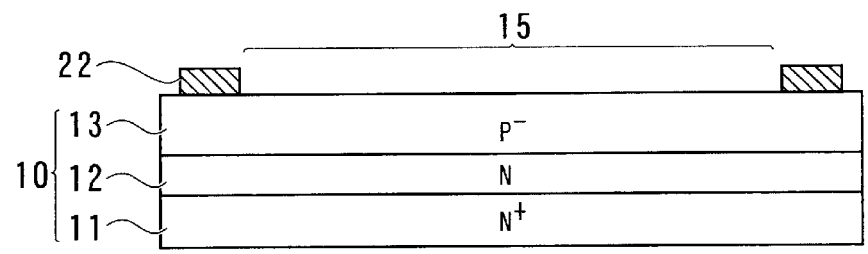
Figure 22:
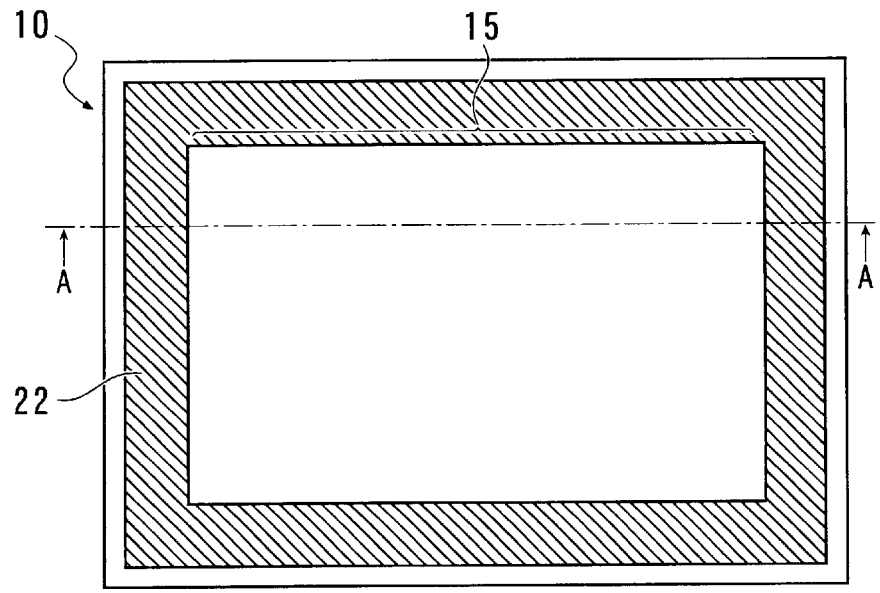
FIG. 22 is a plan view of the assembly shown in FIG. 3.

FIG. 3 shows a patterned primary oxide film 22. The semiconductor substrate 10 with the patterned primary oxide film 22 is shown in FIG. 22. FIG. 3 is a cross-sectional view taken along line A—A of FIG. 22. The withstand voltage region 13 has its surface exposed in a central region 15 of the patterned primary oxide film 22 and also around the patterned primary oxide film 22.

Figure 4:
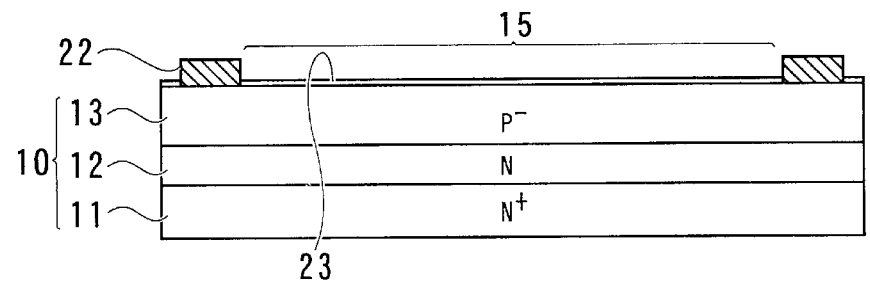

Then, the semiconductor substrate 10 is thermally oxidized to form a gate insulating film 23, which comprises a silicon oxide film thinner than the primary oxide film 21, on the surface of the withstand voltage region 13, as shown in FIG. 4.

Figure 5:
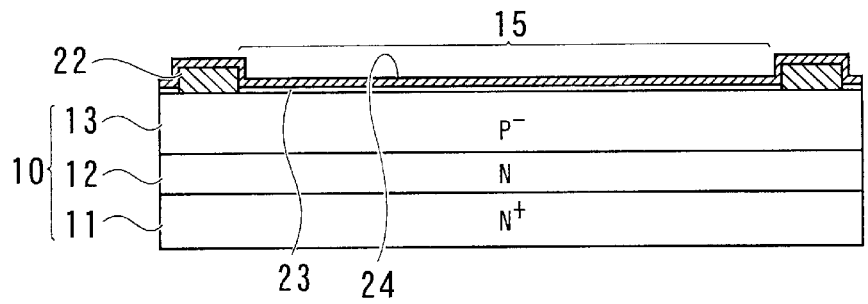

As shown in FIG. 5, a gate electrode film 24 comprising a thin film of polysilicon is formed on the entire surface formed so far of the assembly. The gate electrode film 24 and the gate insulating film 23 are then patterned according to a photolithographic process and an etching process. A patterned gate electrode film 26 is disposed on a patterned gate insulating film 25.

Figure 6:
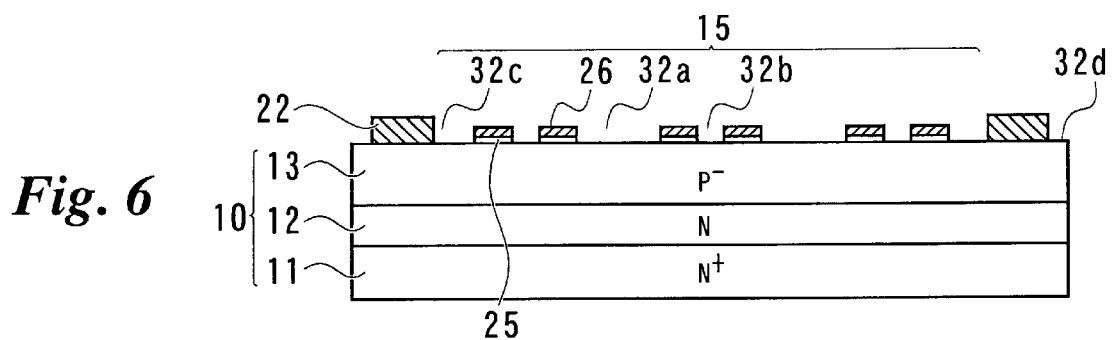
Figure 23:
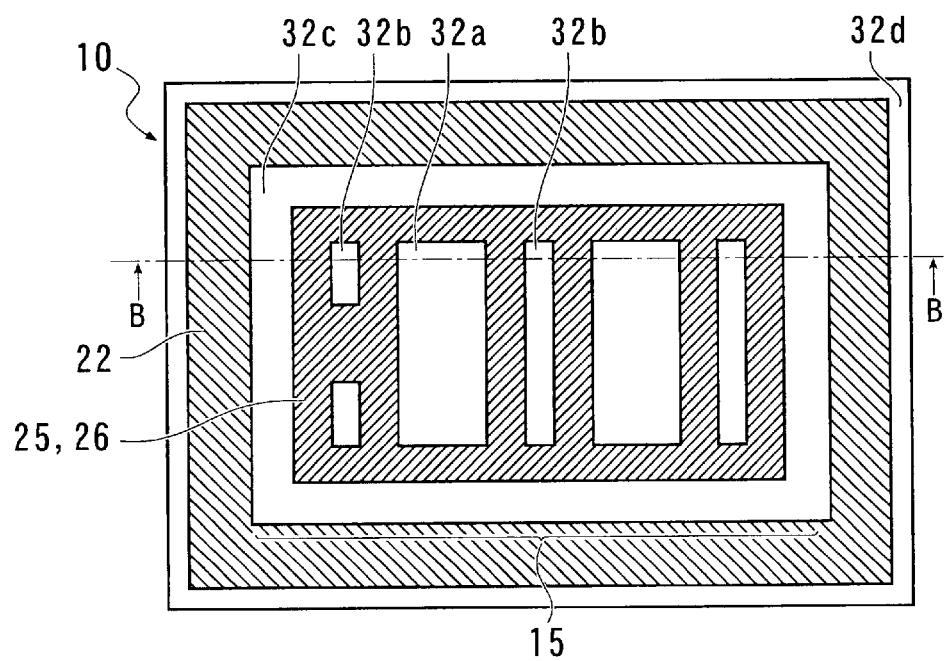
FIG. 23 is a plan view of the assembly shown in FIG. 6.

The semiconductor substrate 10 with the patterned gate electrode film 26 and the patterned gate insulating film 25 is shown in FIG. 23. FIG. 6 is a cross-sectional view taken along line B—B of FIG. 23.

The patterned gate electrode film 26 and the patterned gate insulating film 25 divide the central region 15 of the patterned primary oxide film 22 into active regions 32a where channel regions, described later on, will be formed, and diffusion regions 32b where N-type conductive regions, described later on, will be formed.

The withstand voltage region 13 is exposed in the active regions 32a and the diffusion regions 32b. The active regions 32a and the diffusion regions 32b are surrounded by the gate insulating film 25 and the gate electrode film 26, and are of a narrow rectangular shape. The active regions 32a have a width of 12.0 μm, for example, and the diffusion regions 32b have a width of 6.0 μm, for example, so that the active regions 32a are wider than the diffusion regions 32b.

The gate insulating film 25 and the gate electrode film 26 are spaced from the primary oxide film 22, and the withstand voltage region 13 is exposed in a ring-shaped withstand voltage part 32c lying between the films 25, 26 and the primary oxide film 22. The withstand voltage region 13 is also exposed in an ineffective region 32d lying between the outer peripheral edge of the primary oxide film 22 and the outer end of the semiconductor chip.

Figure 7:
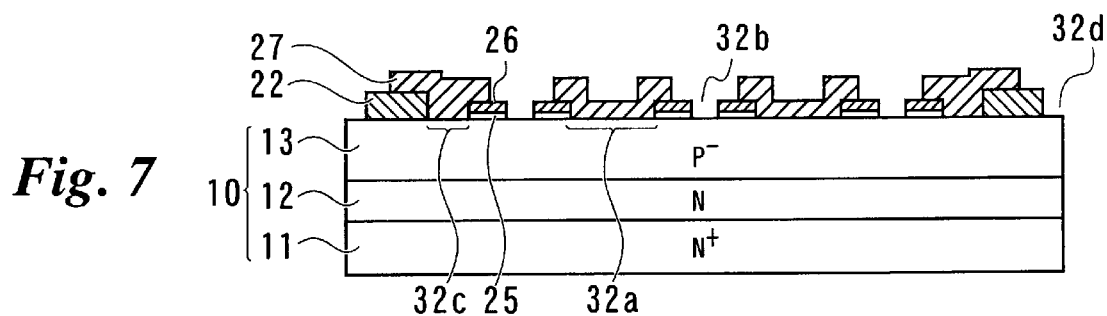

Then, as shown in FIG. 7, a resist film 27 patterned according to a photolithographic process is formed on the surface of the semiconductor substrate 10 shown in FIG. 6.

The resist film 27 covers the withstand voltage part 32c and the active regions 32a, but keeps the ineffective region 32d and the diffusion regions 32b exposed.

Figure 8:
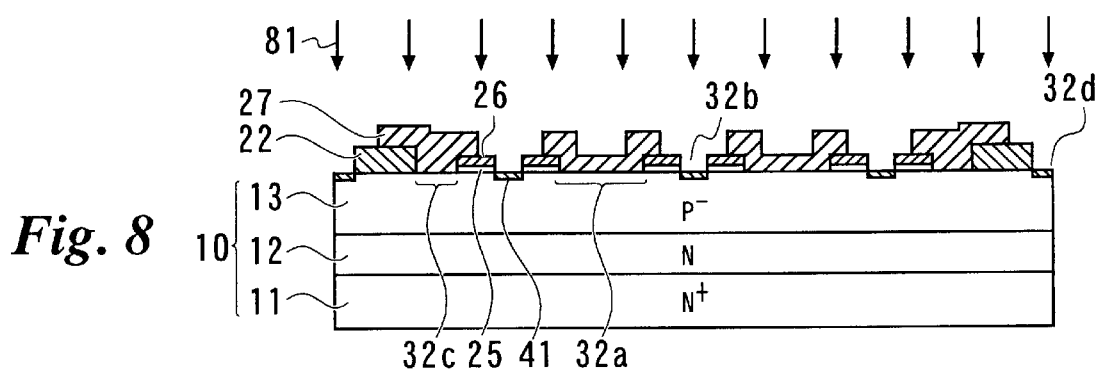

As shown in FIG. 8, an N-type impurity 81 such as of phosphorus ions is applied to the surface of the semiconductor substrate 10. The N-type impurity is introduced into the surfaces of the withstand voltage region 13 which are exposed in the diffusion regions 32b and the ineffective region 32d, with the resist film 27 and the gate electrode film 26 being used as a mask. The N-type impurity introduced into the withstand voltage region 13 produces an impurity layer 41 therein in which the N-type impurity is injected at a high concentration. No phosphorus ions are injected into those regions which are covered by the resist film 27 and the gate electrode film 26.

Figure 24:
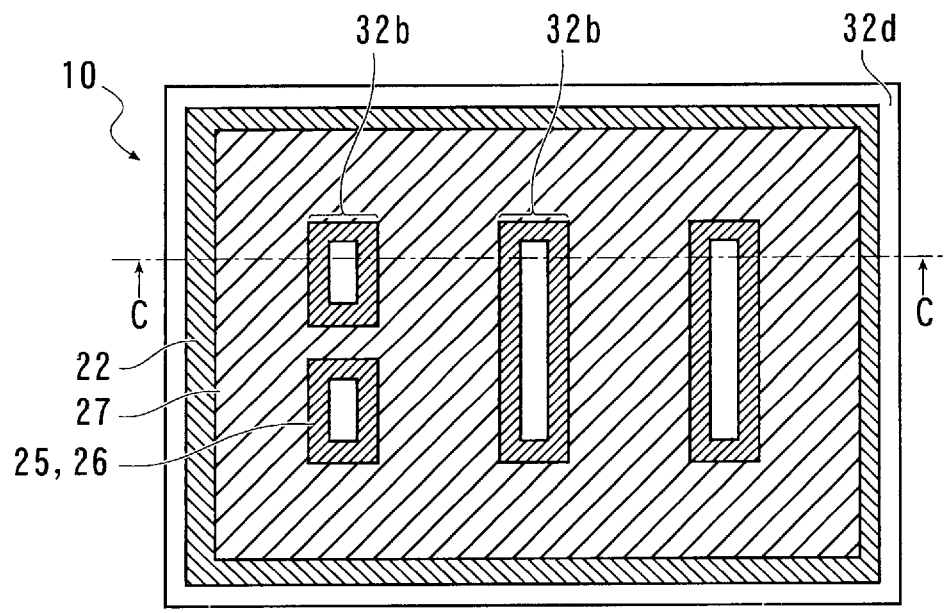
FIG. 24 is a plan view of the assembly shown in FIG. 8.

The semiconductor substrate 10 with the impurity layer 41 formed therein is shown in FIG. 24. FIG. 8 is a cross-sectional view taken along line C—C of FIG. 24.

Figure 9:
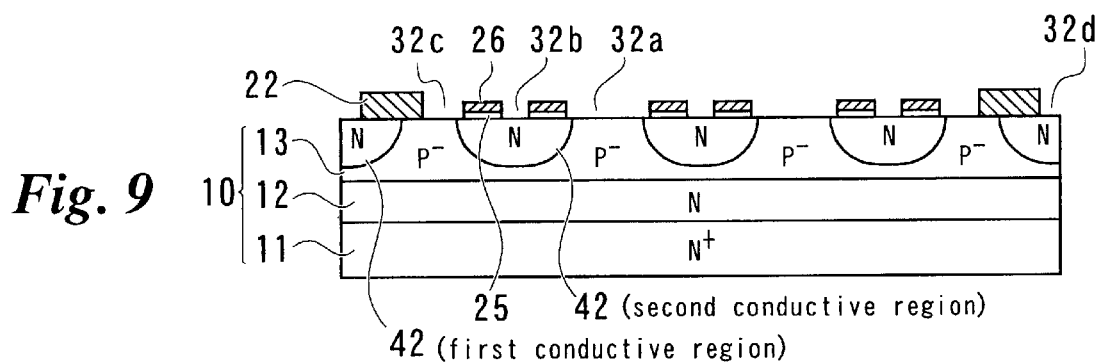

Thereafter, the resist film 27 is removed, and the impurity layer 41 is diffused by a heat treatment, producing N-type conductive regions 42 in the withstand voltage region 13 as shown in FIG. 9. The conductive regions 42 have their bottoms which may be held in contact with the drain layer 12 at this stage or may later be brought into contact with the drain layer 12 in a subsequent heat treatment.

Figure 25:
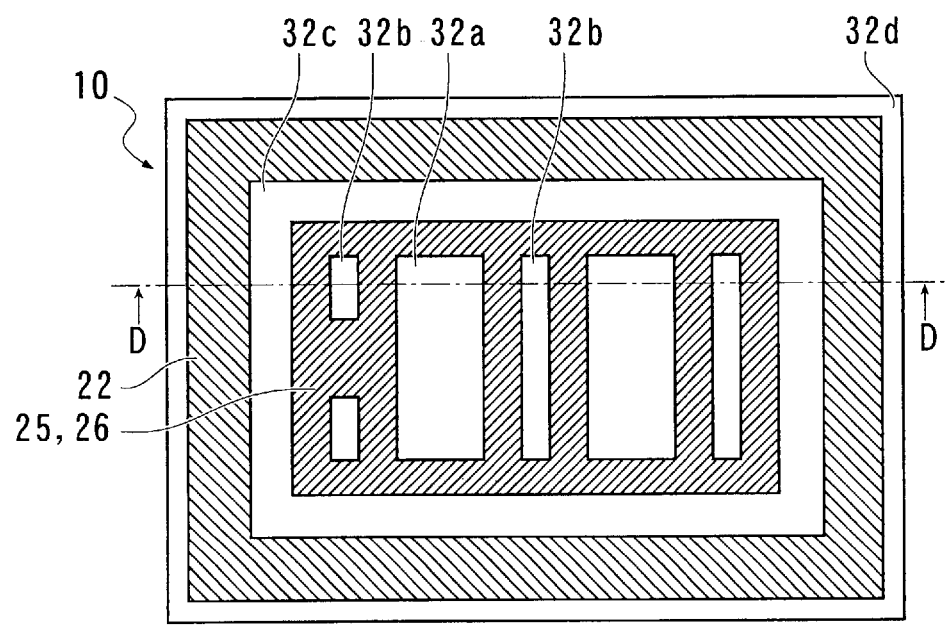
FIG. 25 is a plan view of the assembly shown in FIG. 9.

The conductive regions 42 have surfaces whose ends are laterally diffused beyond the width of the gate electrode film 26 and the gate insulating film 25 into the active regions 32a and the withstand voltage part 32c. FIG. 25 shows the semiconductor substrate 10 with the conductive regions 42 formed therein. The outer peripheral portions of the conductive regions 42 are omitted from illustration in FIG. 25.

FIG. 9 is a cross-sectional view taken along line D—D of FIG. 25. The conductive region 42 formed in the ineffective region 32d is of a ring shape (first conductive region), and the conductive regions 42 are disposed inwardly of the conductive region 42 as the second conductive region and are of a straight shape (second conductive region).

Figure 10:
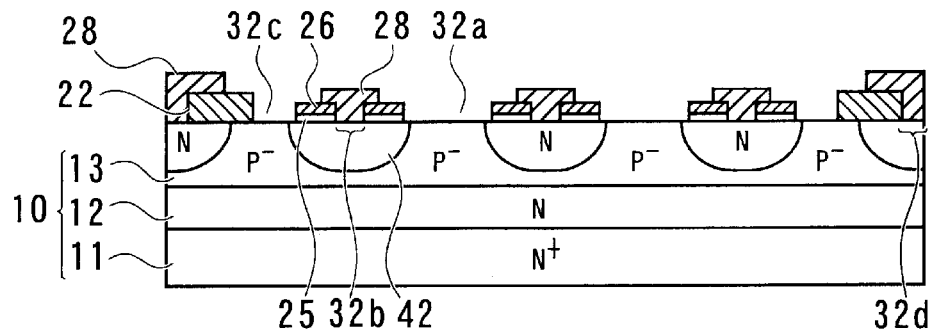
Figure 26:
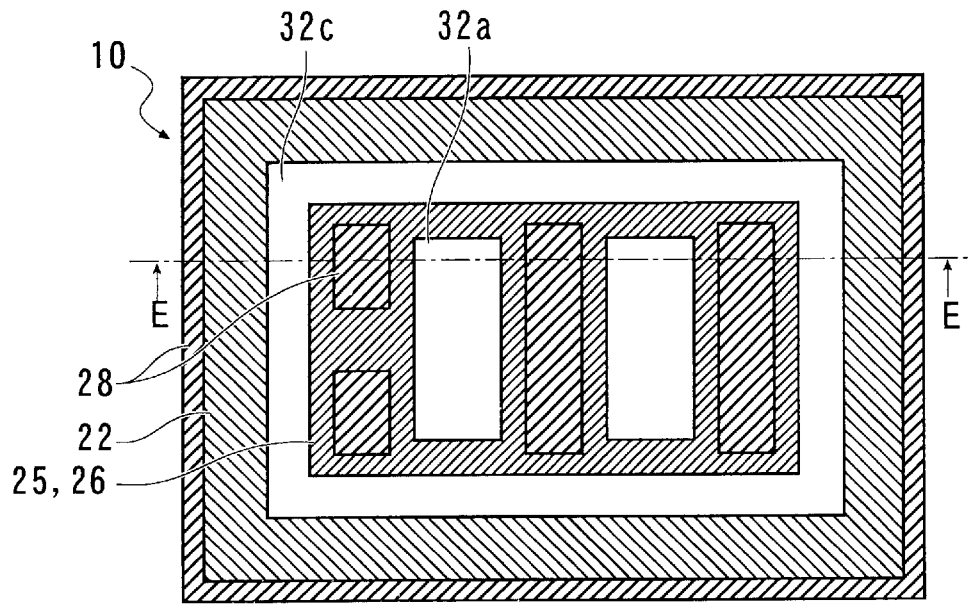
FIG. 26 is a plan view of the assembly shown in FIG. 10.

As shown in FIG. 10, a patterned resist film 28 is formed on the surface of the semiconductor substrate 10 according to a photolithographic process. The resist film 28 covers the diffusion regions 32b and the ineffective region 32d, but keeps the withstand voltage region 13 and the peripheral portions of the conductive regions 42 exposed in the active regions 32a and the withstand voltage part 32c. FIG. 26 shows the semiconductor substrate 10 with the resist film 28 formed thereon. FIG. 10 is a cross-sectional view taken along line E—E of FIG. 26.

Figure 11:
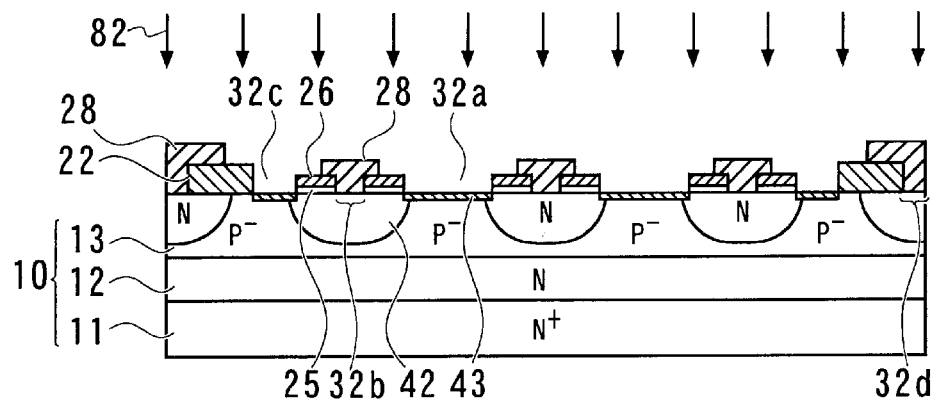

Then, as shown in FIG. 11, a P-type impurity 82 such as of boron ions is applied to the surface of the semiconductor substrate 10. The P-type impurity is introduced into the surfaces of the withstand voltage region 13 and the conductive regions 42 which are exposed in the diffusion regions 32a and the withstand voltage part 32c, with the resist film 28, the gate electrode film 26, and the primary oxide film 22 acting as a mask. The P-type impurity thus introduced produces an impurity layer 43 therein in which the P-type impurity is injected at a high concentration.

Figure 12:
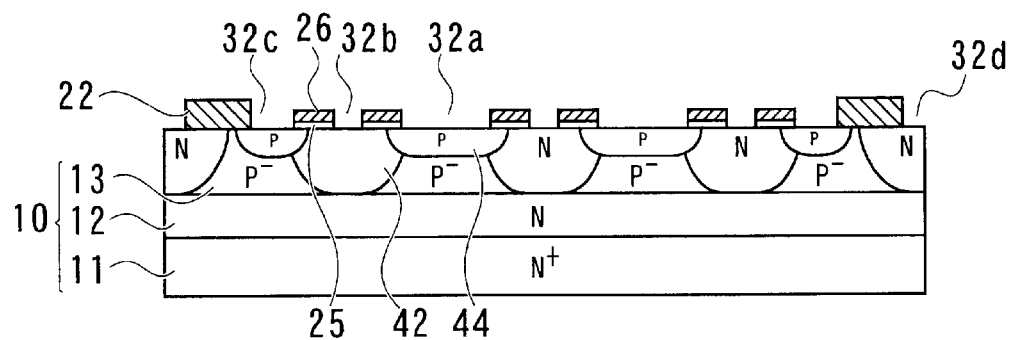

After the resist film 28 is removed, the impurity layer 43 is diffused by a heat treatment, producing P-type base regions 44 as shown in FIG. 12.

Figure 27:
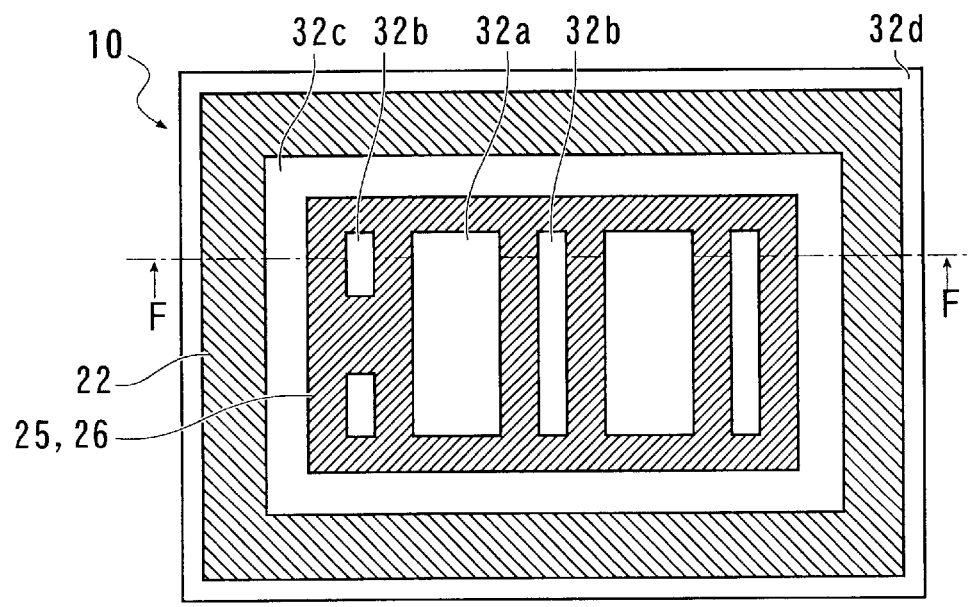
FIG. 27 is a plan view of the assembly shown in FIG. 12.

When the impurity layer 43 is diffused, the ends of the base regions 44 are positioned below the bottoms of the gate insulating films 25 or the bottom of the primary oxide film 22 by lateral diffusion. Therefore, the active regions 32a and the withstand voltage part 32c are of the P conductivity type. When the base regions 44 are diffused, the conductive regions 42 are also diffused. The semiconductor substrate 10 with the P-type base regions 44 diffused therein is shown in FIG. 27. FIG. 12 is a cross-sectional view taken along line F—F of FIG. 27.

Figure 13:
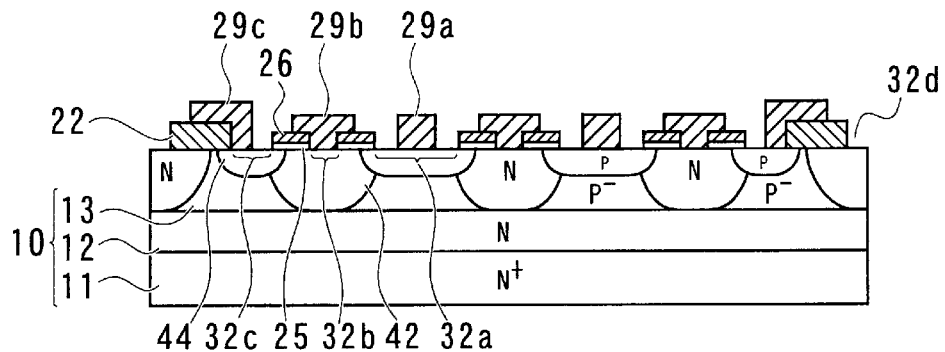

Then, patterned resist films are formed on the surface of the semiconductor substrate 10. As shown in FIG. 13, these patterned resist films include resist films 29a disposed on central areas of the active regions 32a, resist films 29b covering the diffusion regions 32b, and resist films 29c disposed on portions of the withstand voltage parts 32c and the primary oxide film 22.

Figure 28:
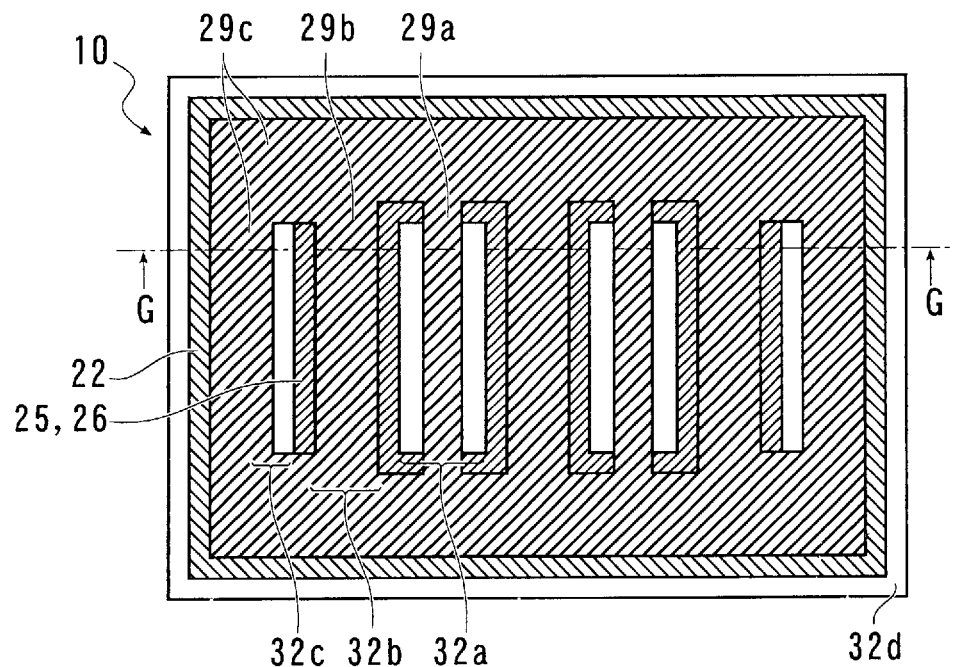
FIG. 28 is a plan view of the assembly shown in FIG. 13.

The semiconductor substrate 10 with the resist films 29a–29c is shown in FIG. 28. FIG. 13 is a cross-sectional view taken along line G—G of FIG. 28. The resist films 29a on the active regions 32a are narrow, with the base regions 44 exposed between longer sides of the resist films 29a and the gate electrode film 26. Both ends of the resist films 29a are connected to the resist films 29c on the withstand voltage parts 32c.

The resist films 29b on the diffusion regions 32b cover the entire surfaces of the conductive regions 42 in the diffusion regions 32b. As shown in FIG. 13, gaps are defined between the resist films 29c on the withstand voltage parts 32c and the gate electrode film 26, leaving the base regions 44 partly exposed on the withstand voltage parts 32c.

Figure 14:
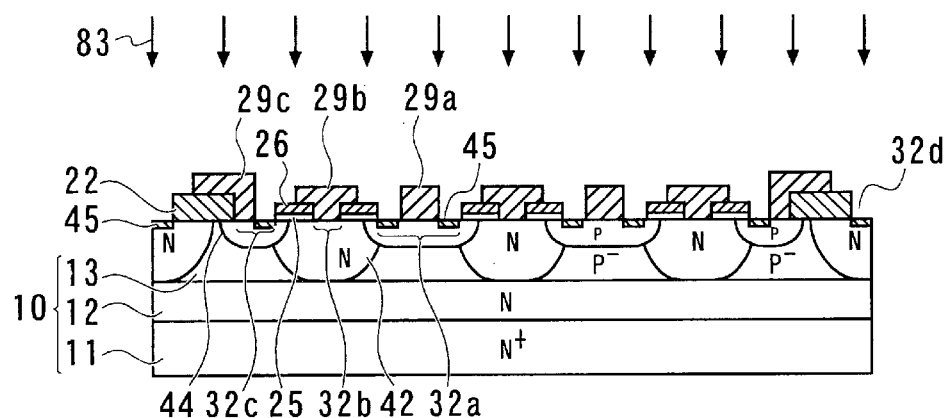

As shown in FIG. 14, an N-type impurity 83 such as of phosphorus ions is applied to the surface of the semiconductor substrate 10. The N-type impurity 83 is introduced into the portion of the surface of the semiconductor substrate 10 which are not covered by the resist films 29a–29c and the gate electrode film 26. In FIG. 14, an impurity layer 45 is produced by the N-type impurity 83 introduced at a high concentration.

Figure 15:
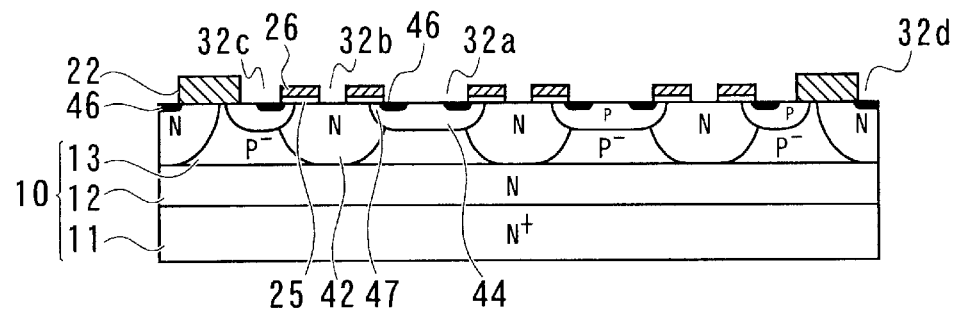

After the resist films 29a–29c are removed, the assembly is heated to diffuse the impurity layer 45 into source regions 46 shown in FIG. 15. The ends of the source regions 46 near the gate electrode film 26 are positioned below the gate insulating film 25 by lateral diffusion. The surfaces of the base regions 44 below the gate insulating film 25 and between the source regions 46 and the conductive regions 42 serve as channel regions 47.

In the semiconductor substrate 10, the surfaces of the base regions 44 are exposed at the central regions of the active regions 32a, and the exposed surfaces of the source regions 46 are placed parallel to each other.

In the diffusion regions 32b, the surfaces of the conductive regions 42 are exposed. In the withstand voltage parts 32c, the surfaces of the source regions 46 are exposed near the gate electrode film 26, and the base regions 44 are exposed near the primary oxide film 22.

Figure 16:
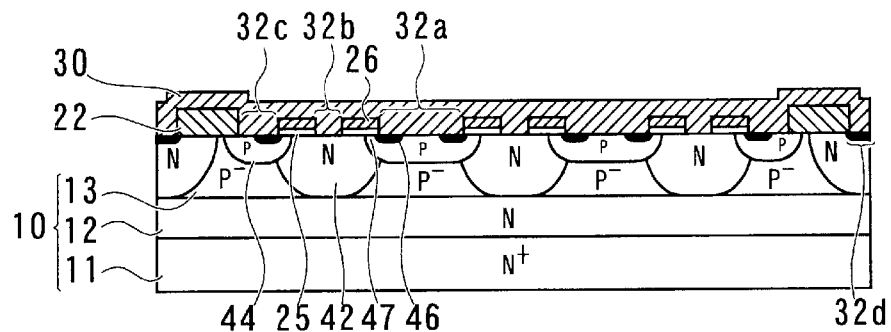

Then, as shown in FIG. 16, an interlayer insulation film 30 comprising a silicon oxide film is formed on the entire surface of the semiconductor substrate 10, and then patterned into interlayer insulation films 31a, 31b (see FIG. 17) according to a photolithographic process and an etching process.

The central regions of the active regions 32a and the withstand voltage regions 32c near the gate electrode film 26 are not covered with the interlayer insulation film 30, exposing the surfaces of the base regions 44 and the surfaces of the source regions 46. The surfaces of the diffusion regions 32b are covered with the interlayer insulation films 31a. No resist film is disposed on the surface of the ineffective region 32d, exposing the surfaces of the source regions 46 disposed in the conductive regions 42.

Figure 17:
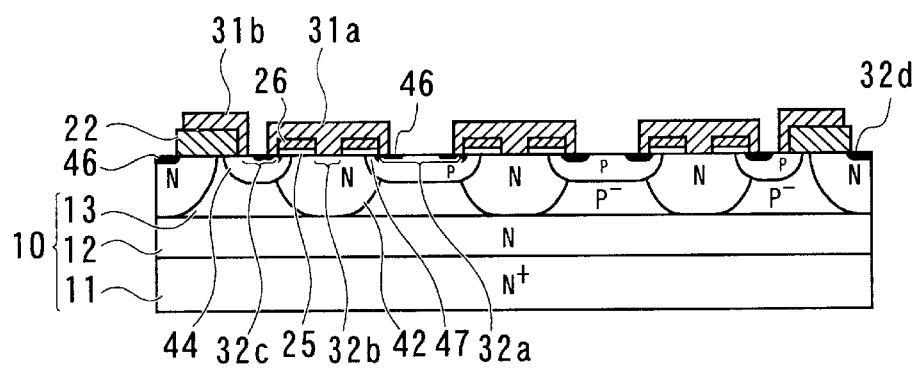
Figure 29:
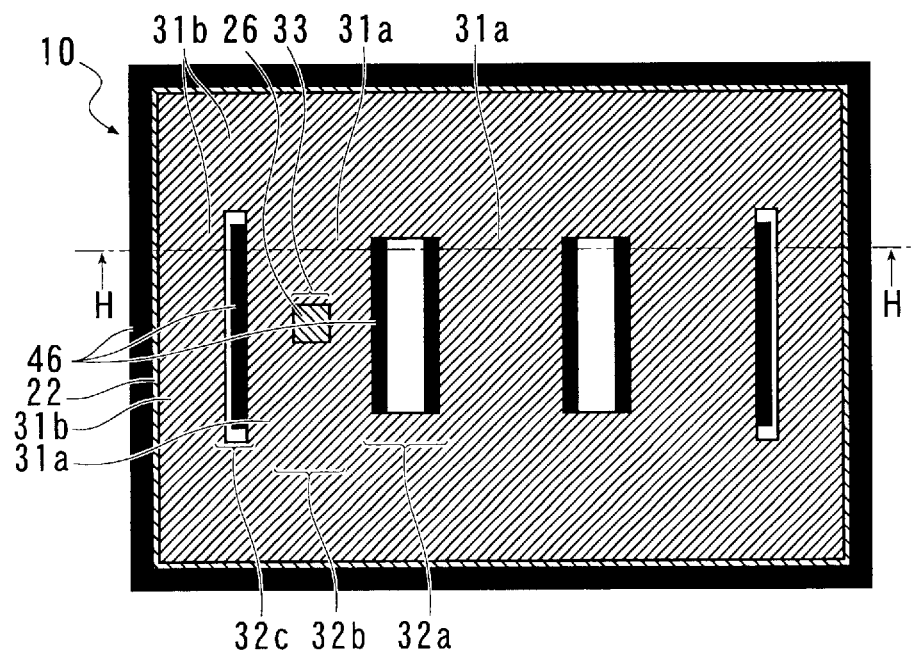
FIG. 29 is a plan view of the assembly shown in FIG. 15.

The semiconductor substrate 10 with the patterned interlayer insulation films 31a, 31b formed thereon is shown in FIG. 29. FIG. 17 is a cross-sectional view taken along line H—H of FIG. 29. In FIG. 29, the interlayer insulation film 30 has a window 33 defined therein with the gate electrode film 26 exposed at its bottom.

Figure 18:
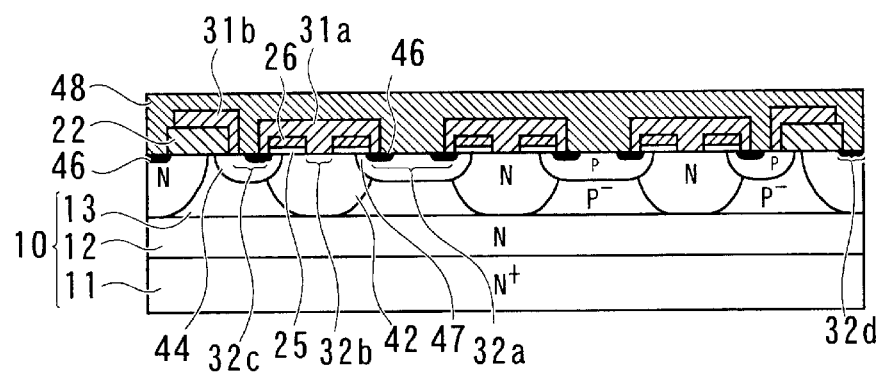

As shown in FIG. 18, a thin metal film 48 is formed on the entire surface of the semiconductor substrate 10. The surfaces of the base regions 44 or the source regions 46 which are exposed in the active regions 32a, the withstand voltage parts 32c, and the ineffective region 32d are held in contact with the thin metal film 48.

Figure 19:
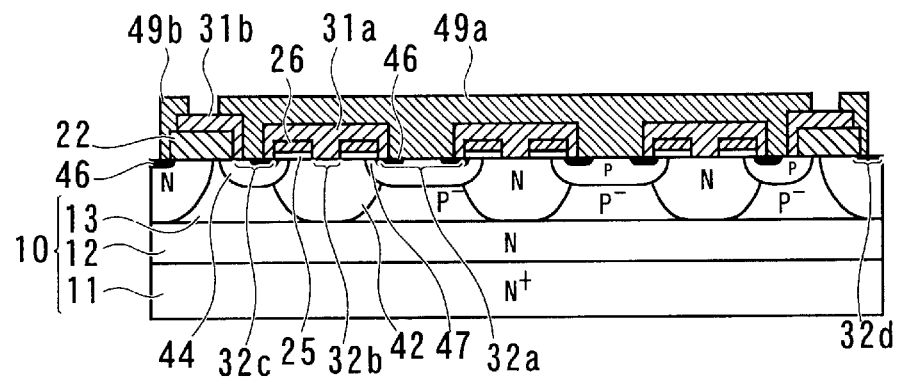
Figure 30:
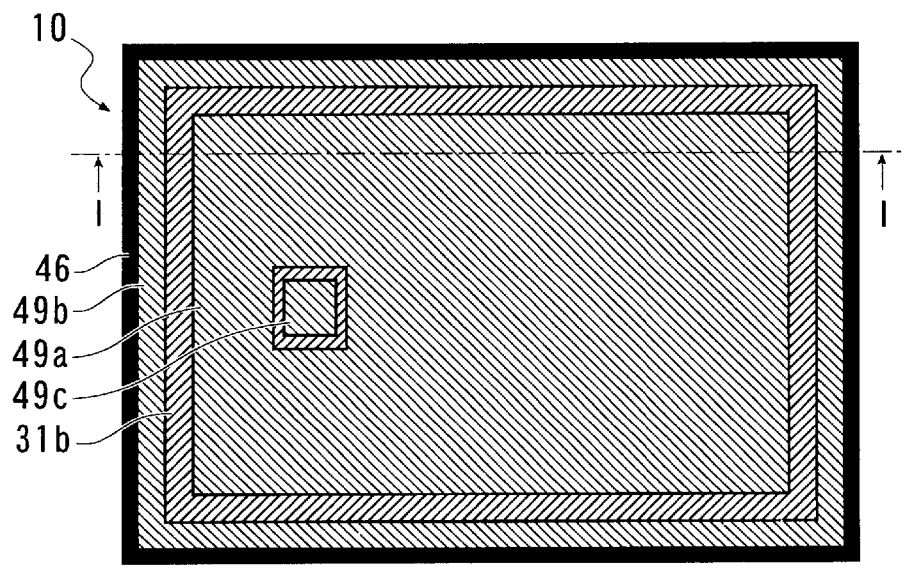
FIG. 30 is a plan view of the assembly shown in FIG. 19.

When the thin metal film 48 is then patterned according to a photolithographic process and an etching process, as shown in FIG. 19, the thin metal film 48 is separated into a source electrode 49a connected to the base regions 44 and the source regions 46 in the active regions 32a and the withstand voltage parts 32c, an equipotential electrode 49b, and a part represented by the reference numeral 49c of FIG. 30.

The semiconductor substrate 10 with the source electrode 49a and the equipotential electrode 49b is shown in FIG. 30. FIG. 19 is a cross-sectional view taken along line I—I of FIG. 30. In FIG. 30, the part represented by 49c is made of a thin metal film 48 and connected to the gate electrode film 26. The part 49c is separated from the source electrode 49a and the equipotential electrode 49b.

Figure 20:
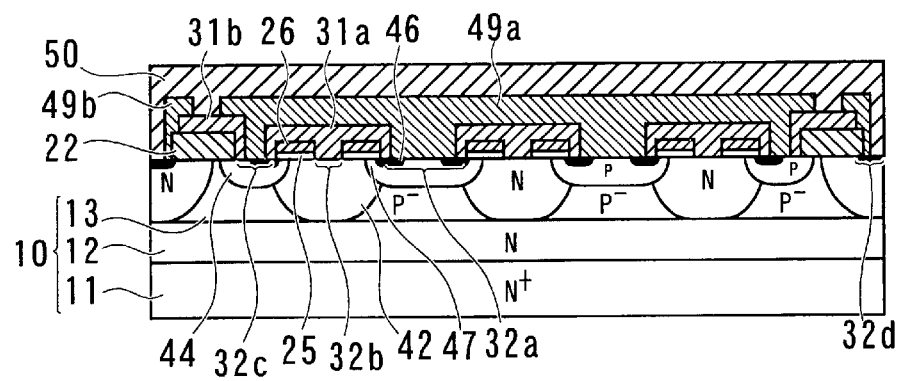

Then, as shown in FIG. 20, a protective film 50 comprising a silicon oxide film or a silicon nitride film is formed, and patterned into a protective film 51 (see FIG. 21) according to a photolithographic process and an etching process.

Figure 21:
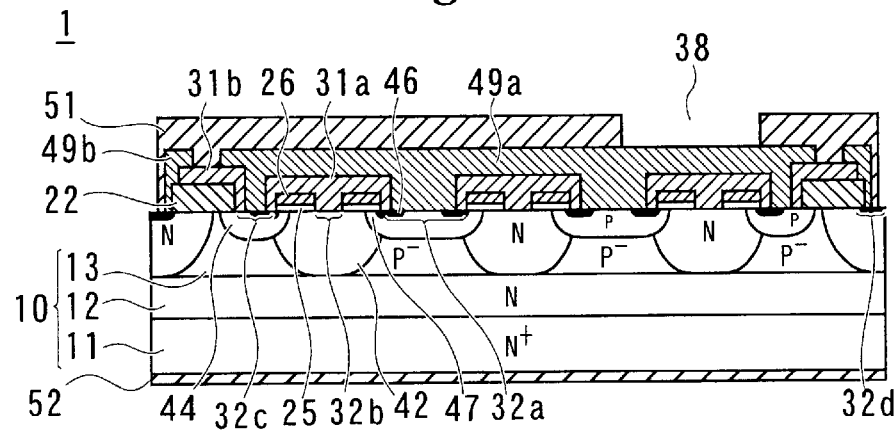
FIG. 21 is a cross-sectional view illustrative of a process of manufacturing a transistor and of an example of a transistor according to the present invention.

As shown in FIG. 21, the source electrode 49a is partly exposed through a window defined in the patterned protective film 51, producing a source electrode pad 38. Finally, a drain electrode 52 comprising a thin metal film is formed on the reverse side (the surface of the N+-type substrate 11) of the semiconductor substrate 10, thus completing a transistor 1 according to an embodiment of the present invention.

Figure 31:
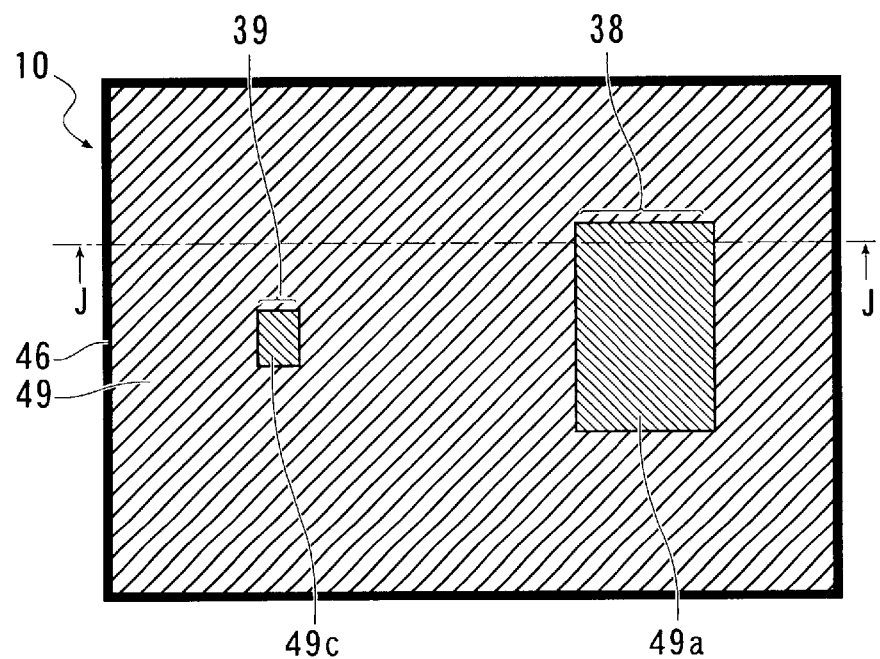
FIG. 31 is a plan view of the assembly shown in FIG. 21.

The semiconductor substrate 10 with the source electrode pad 38 is shown in FIG. 31. As shown in FIG. 31, a gate electrode pad 39 is produced by a window defined in the protective film 51, and a portion 49c of the thin metal film 48 that is connected to the gate electrode film 26 is exposed in the gate electrode pad 39. FIG. 21 is a cross-sectional view taken along line J—J of FIG. 31.

The base regions 44 of the finally produced transistor 1 have a surface impurity concentration ranging from $1 \times 10^{17}$ to $1 \times 10^{18}/cm^3$, which is higher than the concentration of the withstand voltage region 13. The source regions 46 have a surface impurity concentration ranging from $1 \times 10^{19}$ to $4 \times 10^{20}/cm^3$, which is higher than the concentration of the base regions 44. The conductive regions 42 have a surface impurity concentration ranging from $5 \times 10^{14}$ to $1 \times 10^{16}/cm^3$, which is higher than the concentration of the withstand voltage regions 13 but lower than the concentration of the base regions 44.

For operating the transistor 1, the source electrode 49a is placed on the ground potential, a positive voltage is applied to the drain electrode 52, and a gate voltage equal to or higher than a threshold voltage is applied to the gate electrode film 24. An inverted layer is formed in the surfaces of the channel regions 47, connecting the surfaces of the source regions 46 and the surfaces of the conductive regions 42 to each other.

Figure 32A:
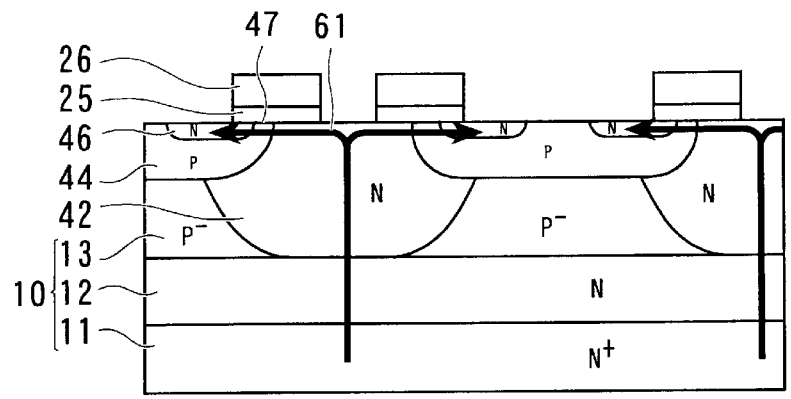
FIG. 32(*a*) is a cross-sectional view showing the manner in which a current flows in the transistor according to the present invention.
Figure 32B:
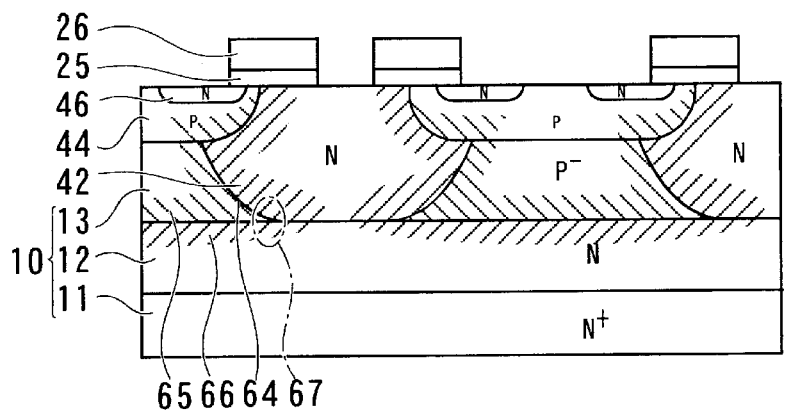

Within the transistor 1, a current flows from the drain electrode 52 via the N+-type substrate 11, the drain layer 12, the conductive regions 42, the inverted layer, and the source regions 46 into the source electrode 49a, as indicated by the arrow 61 in FIG. 32(a). In FIGS. 32(a) and 32(b), the source electrode 49a, the equipotential electrode 49b, and the drain electrode 52 are omitted from illustration.

When the gate electrode film 24 is then connected to the ground potential, the inverted layer is eliminated, and hence the current indicated by the arrow 61 no longer flows.

FIG. 32(b) shows the transistor 1 with the gate electrode film 24 held at the ground potential. In FIG. 32(b), a PN junction 64 formed between the N-type conductive region 42 and the P-type withstand voltage region 13 and base regions 44 is reverse-biased.

Since the impurity concentration of the P-type withstand voltage region 13 is essentially the same as the impurity concentration of the drain layer 12, a depletion layer spreads on both sides of the PN junction 64.

Specifically, a depletion layer 65 spreads into the P-type impurity region (the base regions 44 and the withstand voltage region 13), and a depletion layer 66 spreads into the N-type impurity region (the conductive regions 42 and the drain layer 12).

The conductive regions 42 is shaped such that it is wider on its surface and becomes progressively narrower along its depth away from the surface to the drain layer 12. The low-concentration P-type withstand voltage region 13 has a projecting region 67 (see FIG. 32(b)) that projects into an N-type region formed by the drain layer 12 and the conductive regions 42.

The projection portion 67 is sandwiched between the conductive regions 42 and the drain layer 12 which are of different polarities. The PN junction formed in the position of the projecting portion 67 tends to spread toward the projecting portion 67.

Figure 33:
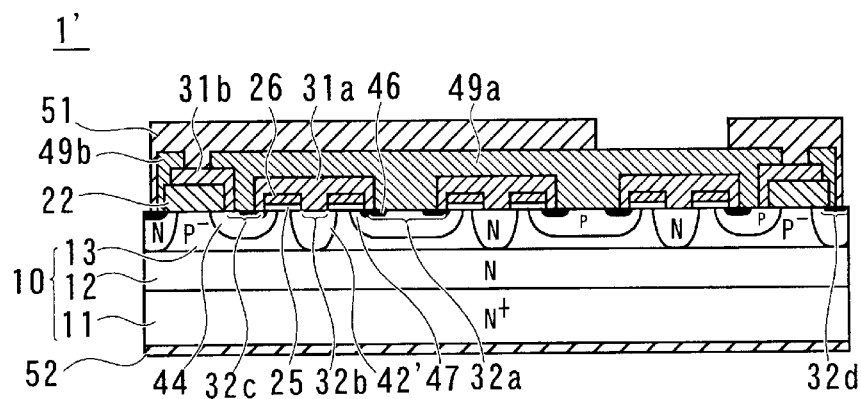
FIG. 33 is a cross-sectional view showing the shape of a withstand voltage region.
Figure 34:
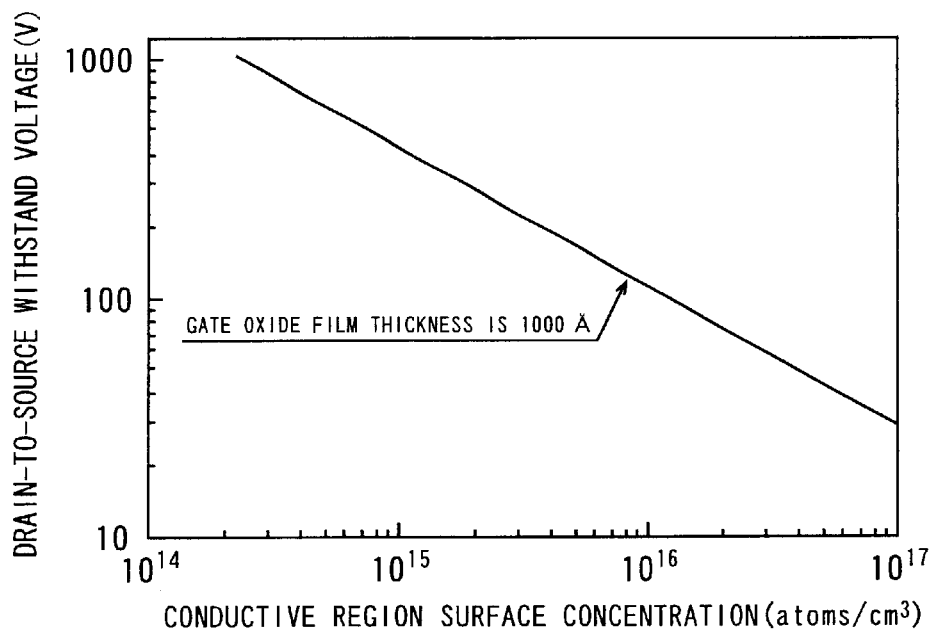
FIG. 34 is a graph showing the relationship between the surface concentration of a conductive region and the withstand voltage between a source and a drain.
Figure 35:
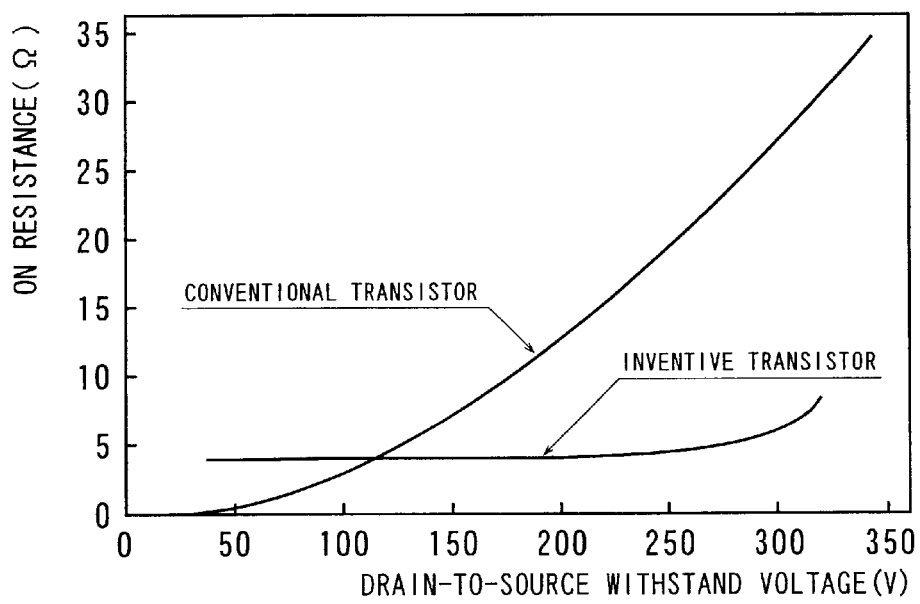
FIG. 35 is a graph showing the relationship between the withstand voltage between a source and a drain and the conduction resistance.

In the transistor 1, since the conductive regions 42 are deeply diffused, they are laterally diffused beyond the gate insulating film 25. However, if the withstand voltage region 13 is thin as with a transistor 1' shown in FIG. 33, then conductive regions 42' may be connected to the drain layer 12 even though they are not deeply diffused. In this modification, the ends of the conductive regions 42' are positioned at the bottom of the gate insulating film 25.

In the transistor 1', the base regions 44 are diffused from the surface of the withstand voltage region 13, as in the case with the transistor 1. However, unlike the transistor 1, the base regions 44 are spaced from the conductive regions 42'.

The gate insulating film 25 is disposed on the surfaces of the withstand voltage region 13 which are sandwiched between the base regions 44 and the conductive regions 42', and the gate electrode film 26 is disposed on the gate insulating film 25. In the transistor 1', therefore, channel regions where an inverted layer is formed include the surfaces of the base regions 44 between the source regions 46 and the conductive regions 42' and the surfaces of the withstand voltage region 13 positioned below the gate insulating film 25 and between the source regions 46 and the conductive regions 42'.

Figure 36:
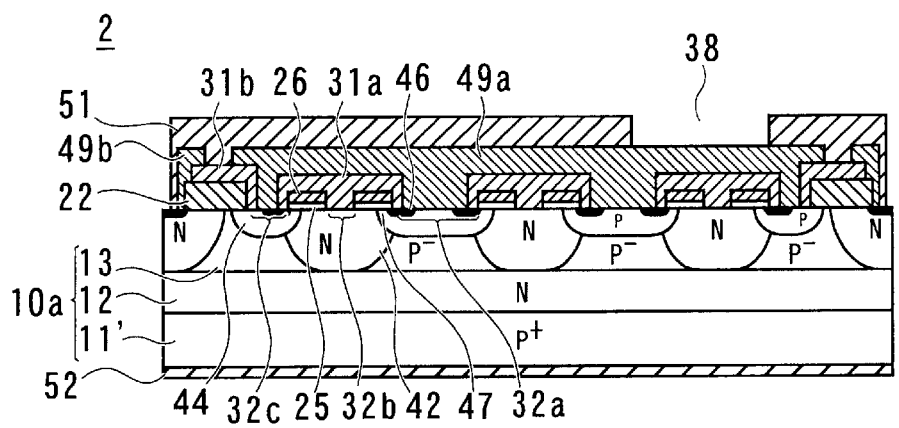
FIG. 36 is a cross-sectional view of a transistor having an IGBT structure according to the present invention.

A transistor according to a second embodiment of the present invention will be described below. FIG. 36 shows a transistor 2 having a semiconductor substrate 10a that comprises a P+-type substrate 11', instead of the N+-type substrate 11. The transistor 2 is in the form of a transistor (IGBT) having the same structure as the transistor 1. The P+-type substrate 11' has a concentration ranging from $3 \times 10^{18}$ to $2 \times 10^{19}$ atoms/cm$^3$.

Therefore, the transistor according to the present invention covers an IGBT.

Figure 37:
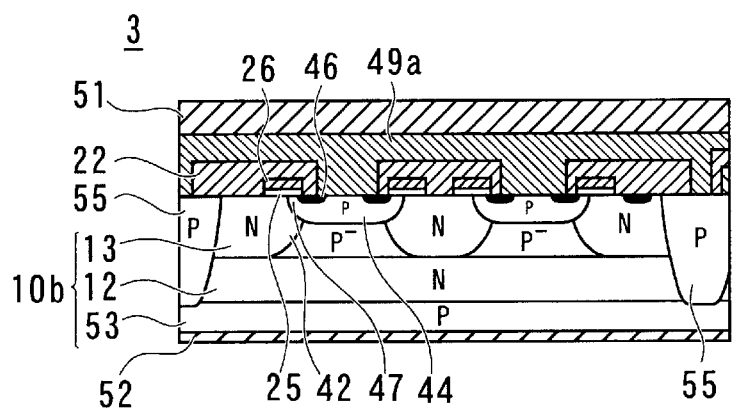
FIG. 37 is a cross-sectional view of a transistor according to the present invention which is formed in an integrated circuit.

A transistor according to a third embodiment of the present invention will be described below. FIG. 37 shows a transistor 3 having a semiconductor substrate 10b that comprises a P-type substrate 53, instead of the N+-type substrate 11. The transistor 3 has P-type isolation regions 55 which are produced by diffusing a P-type impurity from the surface of the semiconductor substrate 10b and which have bottoms reaching the P-type substrate 53.

The semiconductor substrate 10b has other electric elements such as horizontal MOSFETs, etc., and the transistor 3 is electrically isolated from other elements by the isolation regions 55. The source diffusion layers 46 formed in the conductive regions 42 are connected to drain electrodes (not shown).

The transistor 3 has a drain electrode insulated from the gate electrode film 26 and positioned on the same surface as the surface where the gate electrode film 26 of the semiconductor substrate 10b is positioned.

Thus, the transistor 3 can be formed in the semiconductor substrate 10b where an integrated circuit is constructed. Therefore, the transistor according to the present invention covers an integrated circuit.

Figure 38:
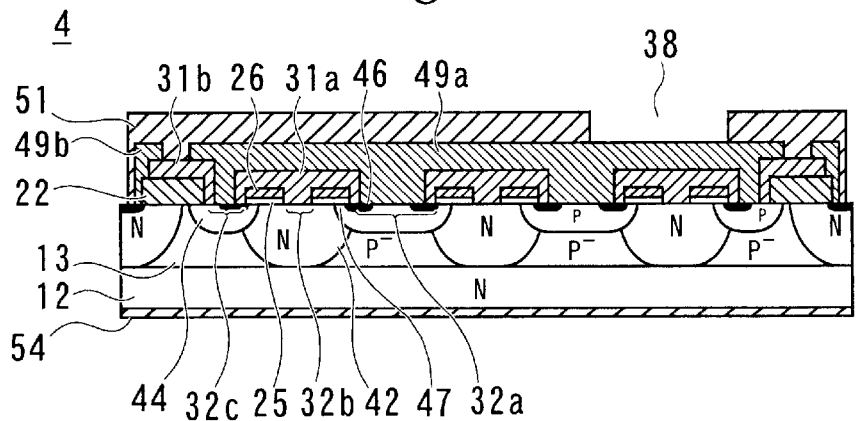
FIG. 38 is a cross-sectional view of a transistor according to the present invention which is a Schottky-junction IGBT.
Figure 39:
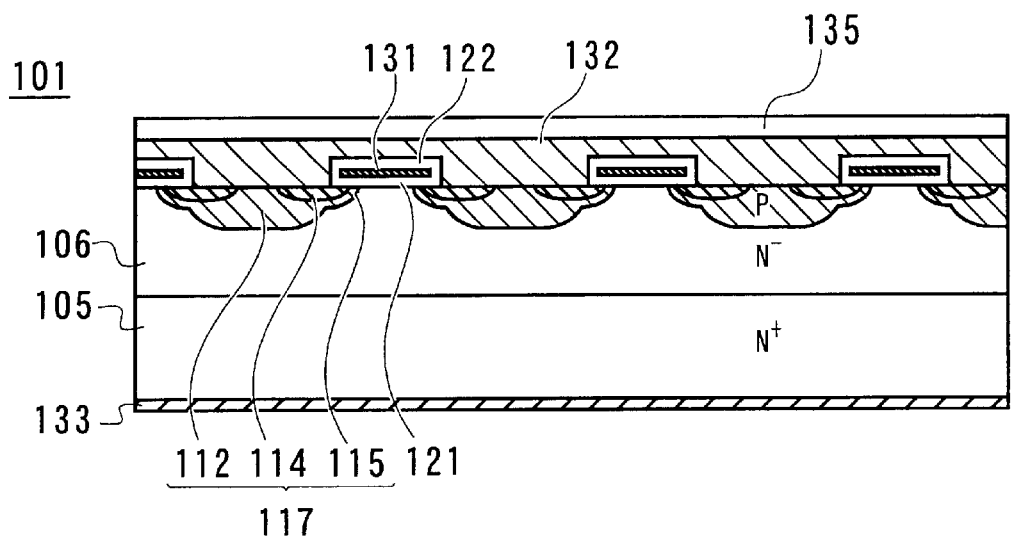
FIG. 39 is a cross-sectional view of a conventional MOSFET.
Figure 40:
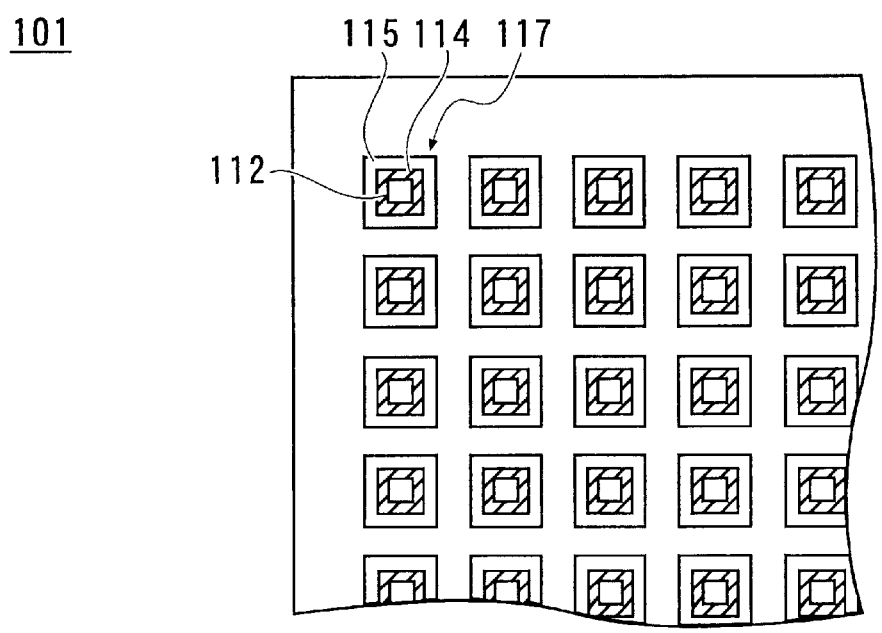
FIG. 40 is a plan view of the conventional MOSFET.

FIG. 38 shows an IGBT-type transistor 4 in which a metal electrode film 54 is disposed on a low-concentration N-type drain layer 12, with a Schottky junction formed between the drain layer 12 and the metal electrode film 54. When the transistor 4 is turned on, a P-type carrier is introduced from the metal electrode film 54 into the drain layer 12, so that the transistor 4 operates in an IGBT mode.

Therefore, the transistor according to the present invention covers a Schottky-junction IGBT.

In the above description, the N type is a first conductivity type and the P type is a second conductivity type. The channel regions are of the P type, with an N-type inverted layer formed in the surface of the channel regions. According to the present invention, however, the P type may be a first conductivity type and the N type may be a second conductivity type. Specifically, a P-type conductive region may be formed in an N-type withstand voltage region, and then an N-type base region and a P-type source region may be formed, with a gate insulating film and a gate electrode film disposed on an N-type channel region. In this case, the conductivity type of the inverted layer is a P type.

In the above embodiments, the withstand voltage region 13 of the second conductivity type is formed by growing a layer of single silicon crystal on the surface of the drain layer 12 of the first conductivity type according to epitaxial growth. However, the drain layer 12 of the first conductivity type may be formed with an increased thickness, and an impurity of the second conductivity type may be diffused into the surface of the drain layer 12 to form the withstand voltage region 13 in the surface of the drain layer 12.

The gate insulating film is not limited to the silicon oxide film, but may be a silicon nitride film.

According to the present invention, the transistor is of a high withstand voltage and a low conduction resistance.

Although certain preferred embodiments of the present invention have been shown and described in detail, it should be understood that various changes and modifications may be made therein without departing from the scope of the appended claims.

What is claimed is:

1. A transistor comprising:
   a semiconductor substrate having a drain layer of a first conductivity type and a withstand voltage region of a second conductivity type disposed on said drain layer;
   a conductive region of the first conductivity type formed by an impurity partly diffused into the semiconductor substrate from the side of said withstand voltage region, said conductive region having a bottom connected to the drain layer of the first conductivity type;
   a base region of the second conductivity type formed by an impurity partly diffused into the semiconductor substrate from a surface of said withstand voltage region;
   a source region of the first conductivity type formed in said base region;
   a gate insulating film having a central region positioned on said base region, an end positioned on said conductive region, and an opposite end positioned on said source region;
   a gate electrode film disposed on said gate insulating film;
   a channel region positioned between said source region and said conductive region and including a surface of said base region below said gate insulating film;
   a source electrode electrically connected to said source region and said base region; and
   a drain electrode electrically connected to said drain layer, wherein
   said base region is spaced from said conductive region, said gate insulating film and said gate electrode film are disposed on the surfaces of said source regions, said base region, said withstand voltage region and said conductive regions, said gate insulating film being in direct contact with said base region and said withstand voltage region, said base region being in contact with said source electrode,
   and said withstand voltage region is sandwiched between said base region and said conductive region,
   wherein said channel region includes the surface of said withstand voltage region below said gate insulating film.

2. A transistor according to claim 1, wherein said base region has a surface concentration higher than the surface concentration of said withstand voltage region.

3. A transistor according to claim 1, wherein said conductive region has a surface concentration higher than the surface concentration of said withstand voltage region.

4. A transistor according to claim 2, wherein said conductive region has a surface concentration higher than the surface concentration of said withstand voltage region.

5. A transistor according to claim 1, wherein said base region has a surface concentration higher than the surface concentration of said conductive region.

6. A transistor according to claim 4, wherein said base region has a surface concentration higher than the surface concentration of said conductive region.

7. A transistor according to claim 1, wherein said conductive region has a surface surrounded by a region having a conductivity type opposite to the conductivity type of the conductive region.

8. A transistor according to claim 1, further comprising a low-resistance layer of the first conductivity type disposed on a side of said semiconductor substrate remotely from said withstand voltage region, said low-resistance layer having a concentration higher than the concentration of said drain layer.

9. A transistor according to claim 1, further comprising a collector layer of the second conductivity type disposed on a side of said semiconductor substrate remotely from said withstand voltage region.

* * * * *